United States Patent [19]
Liu et al.

[11] Patent Number: 5,635,878
[45] Date of Patent: Jun. 3, 1997

[54] DIFFERENTIAL-TYPE VOLTAGE-CONTROLLED OSCILLATOR WITH LOW-FREQUENCY STABILITY COMPENSATION

[75] Inventors: Ding-Jen Liu; Ying-Tzung Wang, both of Hsinchu, Taiwan

[73] Assignee: United Microelectronics Corporation, Hsinchu, Taiwan

[21] Appl. No.: 546,406

[22] Filed: Oct. 20, 1995

[51] Int. Cl.$^6$ .............................. H03B 5/24; H03L 7/099
[52] U.S. Cl. .................. 331/57; 331/175; 331/177 R; 327/237; 327/270
[58] Field of Search .................. 331/57, 34, 111, 331/175, 177 R; 327/156–159, 237, 256, 257, 270

[56] References Cited

U.S. PATENT DOCUMENTS

| | | | |
|---|---|---|---|
| 5,382,921 | 1/1995 | Estrada et al. | 331/57 X |
| 5,440,277 | 8/1995 | Ewen et al. | 331/57 X |
| 5,469,120 | 11/1995 | Nguyen et al. | 331/57 X |

*Primary Examiner*—David Mis
*Attorney, Agent, or Firm*—Cushman Darby & Cushman, IP Group of Pillsbury Madison & Sutro, L.L.P.

[57] ABSTRACT

A differential-type voltage-controlled oscillator (VCO) with low-frequency stability compensation is disclosed. The differential-type VCO comprises a voltage-to-current converter for converting an input voltage signal into a biasing current signal to control the frequency of the VCO output. The VCO further comprises a number of stages of differential amplifiers connected in cascade. Each of the stages of differential amplifiers includes a pair of differential input PMOS transistors, with each of the PMOS transistors connected to a pair of NMOS load transistors. Each of the pair of NMOS load transistors are connected in parallel. The VCO further comprises a number of stages of bias circuits connected in cascade. Each of the bias circuits is connected to a corresponding stage of the differential amplifiers for receiving the bias current generated by the voltage-to-current converter. Each of the stages of bias circuits comprises a current source for supplying a constant current to maintain the low-frequency voltage-frequency linearity of the output of the VCO, and a biasing PMOS transistor connected in parallel with said current source.

18 Claims, 4 Drawing Sheets

DIFFERENTIAL-TYPE VOLTAGE-CONTROLLED OSCILLATOR WITH LOW-FREQUENCY STABILITY COMPENSATION

BACKGROUND OF THE INVENTION

1. Field of the Invention

The present invention relates in general to differential-type voltage-controlled oscillators. In particular, the present invention relates to a differential-type voltage-controlled oscillator featuring low-frequency stability compensation.

2. Description of Related Art

Conventional voltage-controlled oscillators (hereafter referred to as VCO) employ an input voltage signal to control a bias current signal that is used as the basis for the generation of an electrical oscillation. The oscillation is generated at a frequency that is a function of the voltage of the input signal.

The purpose of constructing a VCO, as the name implies, is to generate an output signal having its frequency controlled by the voltage of the input signal. In other words, the voltage of the input signal is utilized as the input controlling parameter, and the desired result is that the frequency of the output signal, behaving as function of the input voltage, is governed by the voltage parameter on a one-to-one functional basis.

As is well known in the art, it is essential that a stable and known functional relationship should exist between the input voltage and the output frequency parameters. Without this functional characteristic, it is difficult to maintain precise control over the frequency of the generated signal. For example, it is well known to persons skilled in this art that temperature is an important factor that affects the precision of control over the voltage-frequency behavior of the conventional VCO.

Furthermore, inherent electronic noises that exist in digital electronic systems are another annoying factor that obstructs the precision control over the frequency generated by a conventional VCO. For example, noise signals that enter the VCO device via the junction pads of the power and ground lines create an interference that makes it difficult to attain the desired functionality of the VCO.

Figure 1:
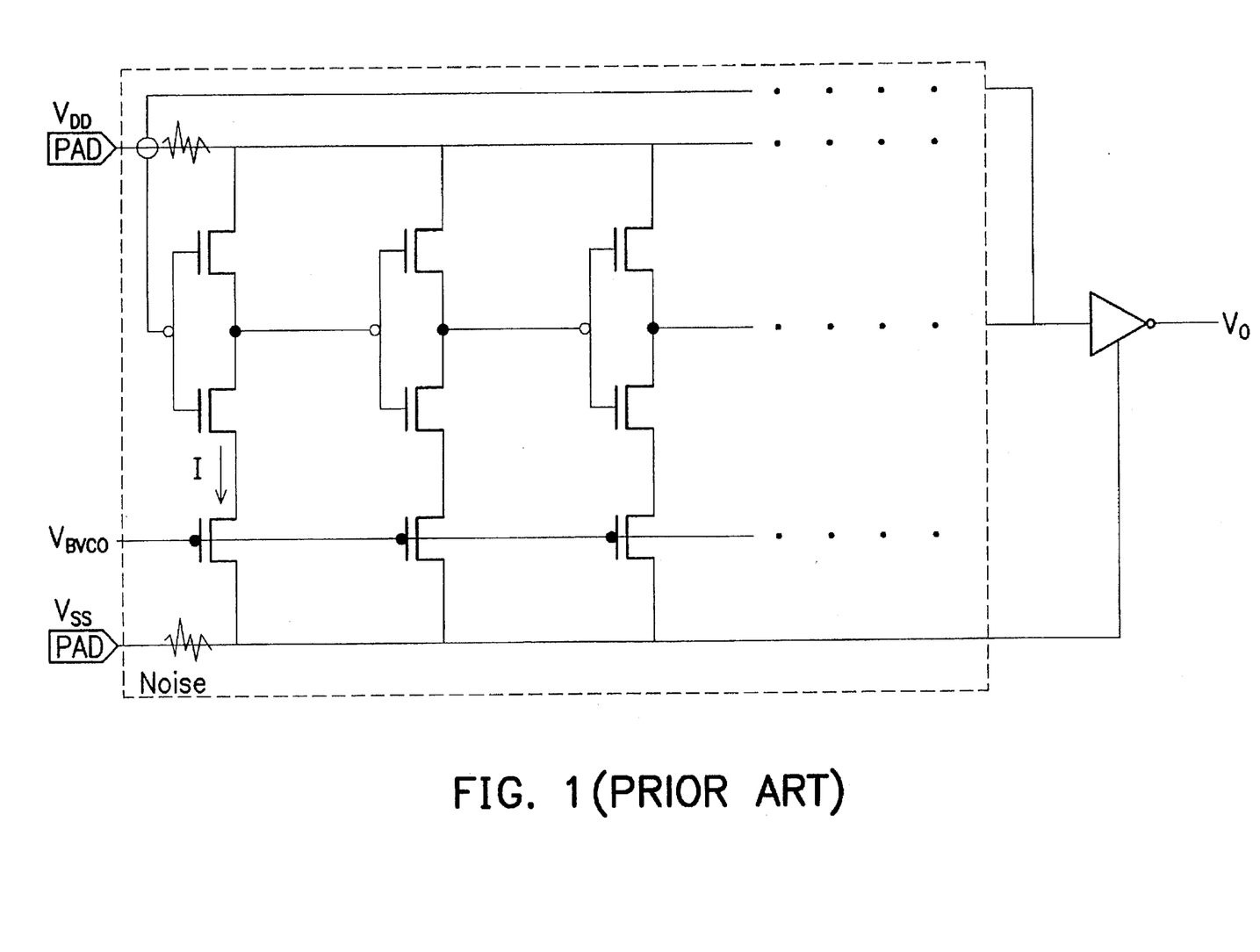
FIG. 1 (Prior Art) is a schematic diagram of a conventional VCO.

FIG. 1 (Prior Art) of the accompanying drawings of the present invention shows the schematic diagram of a conventional VCO, in which an input voltage signal $V_{BVCO}$ is input to the device to control the bias current I for control over the frequency of the generated output signal. In such a conventional arrangement, electronic noises that enter into the VCO device via the lead pads for the power and ground lines tend to produce at least the following disadvantages over the operation of the VCO: First, the duty cycle may not be maintained at 50% as a symmetric oscillation waveform, and second, phase jitters occur in the output frequency signal. In general, the conventional VCO design is characterized by poor noise immunity.

Figure 2:
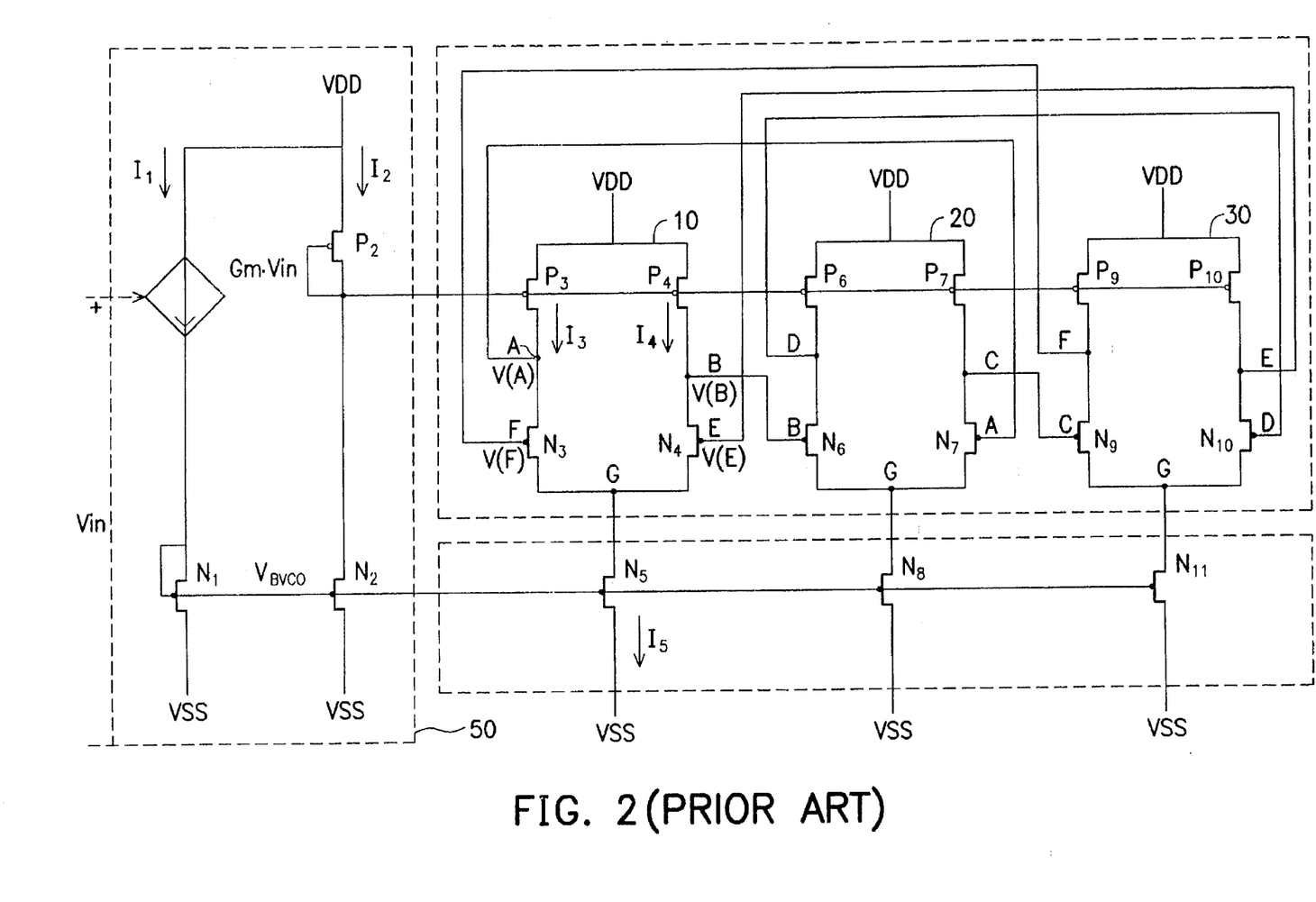
FIG. 2 (Prior Art) is a schematic diagram of a conventional differential-type VCO.

One proposed solution to the above-described poor noise immunity problem of the conventional VCO devices involves making a differential-type VCO utilizing the differential amplifier to improve the overall device noise immunity. FIG. 2 (Prior Art) of the drawing shows the schematic diagram of such a differential-type VCO device in which a voltage-to-current converter 50 is connected to a cascade of three consecutive differential amplifiers 10, 20 and 30 that are each accompanied by the respective one of the three N-type metal-oxide semiconductor (NMOS) transistors $N_5$, $N_8$ and $N_{11}$. Clearly, the cascade is not limited to three, as can be appreciated by persons skilled in the art.

However, as is well known, a differential amplifier relies on the balanced matching among the dimensional factors of its constituent components to maintain its designed operation characteristics. In the implementation of the semiconductor integrated circuit devices, the differential amplifier characteristics are sensitive to change in its fabrication conditions. Any change in the conditions of fabrication is likely to produce a shift in the voltage-frequency characteristics of the produced VCO device.

These prior art differential-type VCO devices have several drawbacks. At least two of the issues are worth mentioning. First, the control of semiconductor fabrication conditions described above is difficult.

For example, consider again the differential-type VCO of FIG. 2 (Prior Art). In the first differential amplifier 10, the gate voltages of the PMOS load transistors $P_3$ and $P_4$ are provided by the PMOS transistor $P_2$ of the voltage-to-current converter 50, while the load currents $I_3$ and $I_4$ of the PMOS transistors $P_3$ and $P_4$ respectively are determined by $I_5$, which is the current passing through the bias current-providing NMOS transistor $N_5$.

In an ideal situation when the channel width/length ratio (W/L ratio) of transistors $P_3$ and $P_4$ are equal, then:

$$(W/L)_{P_3} = (W/L)_{P_4}$$

wherein W represents the transistor channel width and L represents the channel length, the following relationship is established $$\frac{(W/L)_{P_3}}{(W/L)_{P_2}} = \frac{1}{2} \frac{(W/L)_{N_5}}{(W/L)_{N_2}} = K_1,$$

and $$\frac{(W/L)_{N_2}}{(W/L)_{N_1}} = K_2$$

then, there will be a relationship between the currents:

$$\frac{1}{2} \frac{I_5}{I_2} = K_1,$$

and $$\frac{I_2}{I_1} = K_2$$

then $$\frac{I_5}{I_1} = 2K_1 \cdot K_2$$

therefore, $$I_5 = 2(K_1 \cdot K_2)I_1 = 2[K_1 \cdot K_2 \cdot Gm]Vin$$

wherein $G_m$ is the transconductance when the voltage $V_{in}$ is converted into current $I_1$.

The input voltage $V_{in}$ is converted into current $I_1$ by the voltage-to-current converter 50, with the condition that $$I_1 = Gm \cdot Vin$$

Due to the fact that charging/discharging VCO devices have a oscillation frequency that is proportional to the value of the charging/discharging current, it is ensured that the prior art differential-type VCO device does establish an oscillation that has a frequency controlled by the value of the input voltage $V_{in}$.

However, as indicated previously, the situation described by the equations outlined above is an ideal. In reality when these differential-type VCO devices are actually fabricated, the absolute symmetry in the dimensions of the transistor components is less than ideal. The following discussion outlines a situation when the distortion in the component dimensional symmetry is introduced into these prior art differential-type VCO devices. For example, when the width/length ratios of PMOS transistors $P_3$ and $P_4$ can still be considered to establish symmetry:

$$(W/L)_{P_3} = (W/L)_{P_4},$$

while $$\frac{(W/L)_{P_3}}{(W/L)_{N_5}} > \frac{1}{2} \frac{(W/L)_{P_2}}{(W/L)_{N_2}}$$

then, when all transistors $P_3$, $P_4$ and $N_5$ are operating in their respective saturation regions and have the following current relationships:

$$I_3 > \frac{1}{2} I_5,$$

and $$I_4 > \frac{1}{2} I_5$$

Thus, in the initial stage when $I_3+I_4>I_5$, the currents $I_3$ and $I_4$ would force the voltages V(A) and V(B) at nodes A and B respectively in the first differential amplifier 10 to rise. This rise of node voltage pushes PMOS transistors $P_3$ and $P_4$ from their saturation regions into their linear operating regions. The result is the continuous reduction in the currents $I_3$ and $I_4$ until the equilibrium condition of $I_3+I_4=I_5$ is achieved. At the same time, the gain of the first differential amplifier 10 obtained from output signal V(A) and the input signal V(F) would be:

$$A_{VVCO-1} = \frac{V(B) - V(A)}{V(F) - V(E)} =$$

$$\frac{(gm)_{N_3} + (gm)_{N_4}}{(gd)_{P_3} + (gd)_{P_4}} = \frac{(gm)_{N_4}}{(gd)_{P_4}} = \frac{(gm)_{N_3}}{(gd)_{P_3}},$$

where $g_m$ is the transconductance and $g_d$ is the drain conductance, and $A_{VVCO-1}$ is the voltage gain of the first differential amplifier that must be greater than 1 so that the VCO device can initiate its oscillation.

On the other hand, when the PMOS transistors $P_3$ and $P_4$, as well as the NMOS transistors $N_3$ and $N_4$ are all operating in their respective saturation region, the following condition will be established:

$$(gm)_{N_4}=(gm)_{N_3}>(gd)_{P_4}=(gd)_{P_3}$$

When the PMOS transistors $P_3$ and $P_4$ are in their respective linear region of operation, the values $(gd)_{P_3}$ and $(gd)_{P_4}$ will increase, and if the width/length ratio W/L is relatively larger, then:

$$(gd)_{P_3} > (gm)_{N_3},$$

and

-continued $$A_{VVCO-1} = \frac{(gm)_{N_3}}{(gd)_{P_3}} < 1$$

Thus, the voltage gain $A_{VVCO-1}$ might be smaller than the value of 1, if margins for the semiconductor fabrication process design for the PMOS transistor $P_3$ and NMOS transistor $N_3$ are not considered in advance. Such a prior art differential-type VCO with a voltage gain less than 1 will not oscillate at all, since all excitation in its circuitry will cease, with nothing but stable direct currents appearing on the circuit nodes.

In addition to the critical condition necessary for the prior art differential-type VCO devices to ensure the initiation of their oscillation, the second principle drawback of these prior art differential-type VCO devices concerns the oscillation stability in the low frequency region.

Figure 3:
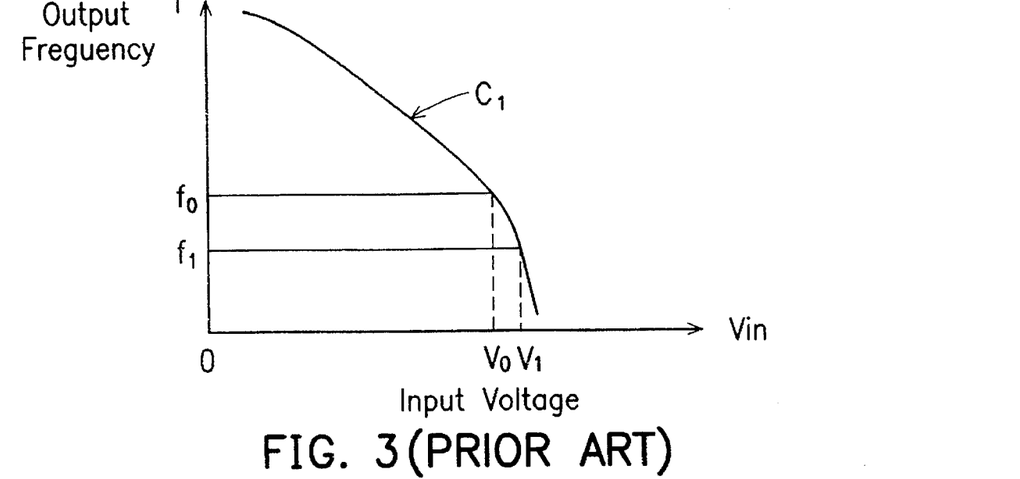
FIG. 3 (Prior Art) is a graph showing the voltage-frequency characteristics of a conventional differential-type VCO.

FIG. 3 (Prior Art) shows the voltage-frequency characteristics of a conventional differential-type VCO. As is depicted in the characteristics curve, the voltage-to-current converter 50 is itself operating in its non-linear region when the bias current in the device is relatively very small. The non-linearity of the voltage-frequency characteristics in this operating region results in the output frequency f with very high sensetivity with respect to the input voltage Vin. For example, the characteristic curve $C_1$ become abruptly, when the input voltage Vin is $V_0$ and the output frequency f is below $f_0$. A typical phenomenon is then caused by the noise inherent in electrical circuit. A small amount of change in the input voltage $V_1$ results in a drastic change in the output frequency $f_1$. Therefore, there is poor noise immunity in the VCO device in that operating region. In the case of prior art differential-type VCO devices, the operating region having poor noise immunity is the low-frequency operating region. Of course, one can always set the effective VCO operating frequency range above this poor noise immunity frequency range, but this results in a severe restriction of the effective operating frequency range of the VCO.

SUMMARY OF THE INVENTION

It is therefore an object of the present invention to provide a differential-type VCO that is compatible with current practical semiconductor fabrication procedure.

It is another object of the present invention to provide a differential-type VCO that has stable low-frequency compensation characteristics.

The present invention achieves the above-identified objects by providing a differential-type VCO with low-frequency stability compensation. The differential-type VCO according to the present invention comprises a voltage-to-current converter for converting an input voltage signal into a biasing current signal to control the frequency of the VCO output. The VCO further comprises a number of stages of differential amplifiers connected in a cascade. Each of the stages of differential amplifiers includes a pair of differential input NMOS transistors, with each of the NMOS transistors connected to a pair of PMOS load transistors. The load transistors include a pair of PMOS transistors which are connected in parallel by connecting each of the drain/source terminals of one load transistor to the corresponding drain terminal of the other. The gate terminal of one of the pair of load transistors is connected to one of the drain/source terminals thereof, and the gate terminal of the other pair of load transistors being connected to the other pair of load transistors. The VCO further comprises a number of stages of bias circuits connected in cascade. Each of the bias circuits is connected to a corresponding stage of the differential amplifiers for receiving the bias current generated by the voltage-to-current converter. Each of the stages of bias circuits comprises a current source for supplying a constant current to maintain the low-frequency voltage-frequency linearity of the VCO output, and a biasing NMOS transistor connected in parallel with said current source.

BRIEF DESCRIPTION OF THE DRAWINGS

Other objects, features and advantages of the present invention will become apparent from the following detailed description of the preferred but non-limiting embodiment. The description is made with reference to the accompanying drawings, wherein.

DETAILED DESCRIPTION OF THE PREFERRED EMBODIMENTS

Figure 4:
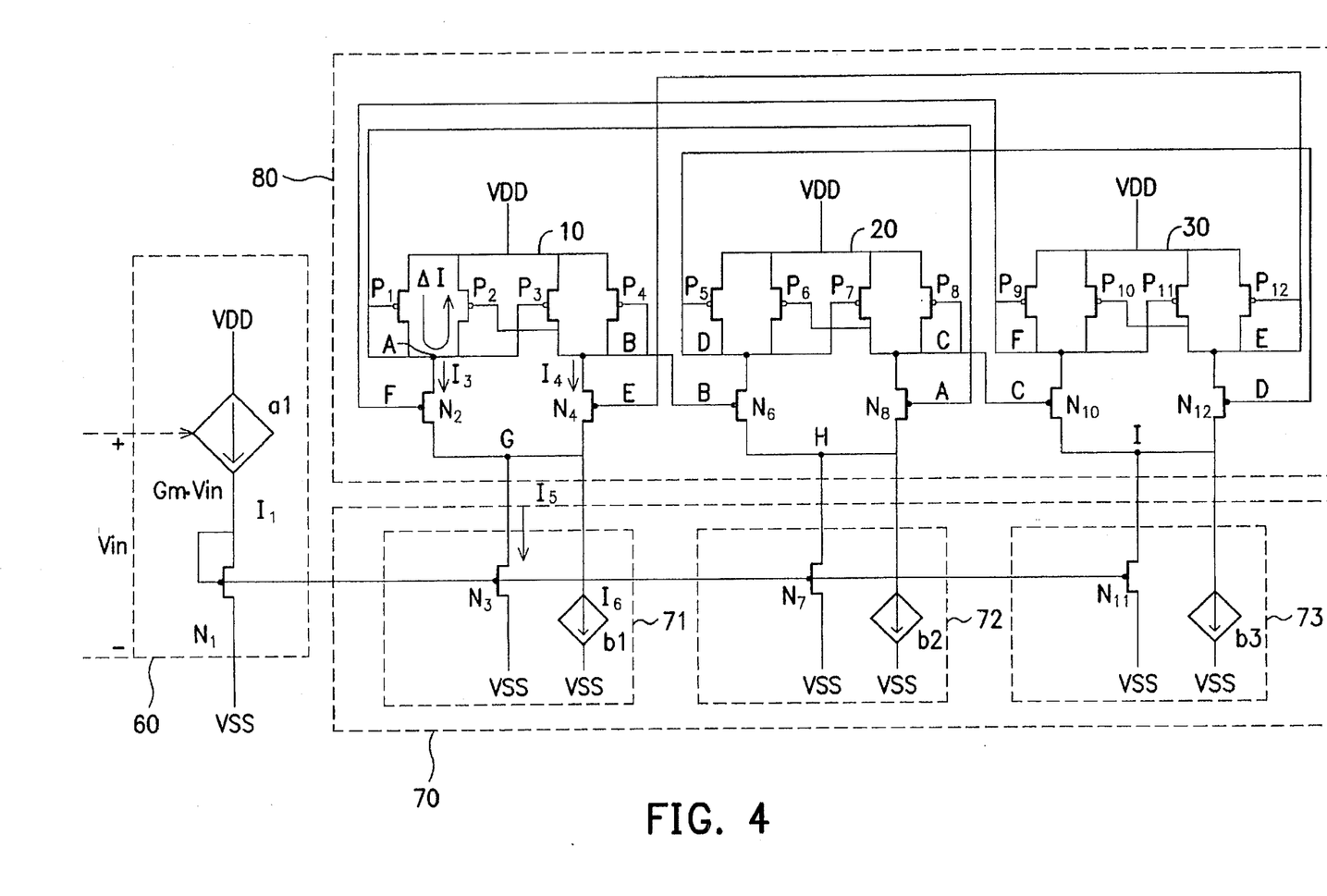
FIG. 4 is a schematic diagram of the differential-type VCO with low-frequency stability compensation in accordance with a preferred embodiment of the present invention.

FIG. 4 is a schematic diagram of the differential-type VCO with low-frequency stability compensation in accordance with a preferred embodiment of the present invention. The differential-type VCO device of the present invention comprises a voltage-to-current converter 60, which includes voltage-controlled current source $a_1$ that is connected to a biasing NMOS transistor $N_1$. The purpose of this voltage-to-current converter 60 is to convert an input voltage signal $V_{in}$ into the biasing current signal $I_1$, which is the basis for the control over the frequency of the generated oscillating signal. The bias current $I_1$ can be expressed as $$I_1 = Gm \cdot Vin$$

The differential-type VCO of the present invention further comprises a multi-stage differential amplifier cascade 80. Each of the stages of the differential amplifiers has its output connected to the input of the next amplifier and the output of the last amplifier in the cascade is connected back to the input of the first amplifier in the cascade. The cascade 80 includes three differential amplifiers 10, 20 and 30. The three amplifiers are of the same configuration. Each of the differential amplifiers comprises a pair of differential input NMOS transistors that are each connected to a pair of PMOS load transistors. In the first stage differential amplifier 10 has a pair of differential input NMOS transistors $N_2$ and $N_4$, and transistor $N_2$ is connected to a pair of PMOS load transistors $P_1$ and $P_2$, while the other input transistor $N_4$ is connected to another pair of PMOS transistors $P_3$ and $P_4$.

Each of the pairs of PMOS load transistors are connected in parallel so that one transistor has its gate connected to its own drain terminal, while the other gate thereof is connected to the other pair of the PMOS transistors. For example, in the first pair of PMOS transistors $P_1$ and $P_2$ for NMOS transistor $N_2$, the two transistors are connected in parallel at their corresponding drain/source terminals, while transistor $P_1$ has its gate connected further to its own drain terminal, and the gate of the transistor $P_2$ is connected to the other PMOS transistors pair ($P_3$ and $P_4$).

The W/L ratios of the four PMOS transistors $P_1$, $P_2$, $P_3$ and $P_4$ are related by the following expression:

$$(W/L)_{P_1} = (W/L)_{P_2} = (W/L)_{P_3} = (W/L)_{P_4}$$

In other words, the width/length ratios for the four PMOS transistors are equal.

The differential-type VCO of the present invention further comprises a bias circuit cascade having multi-stage bias circuits. In the embodiment of FIG. 4, this cascade 70 has three bias circuits 71, 72 and 73, each connected to a corresponding one of the differential amplifiers that link up the amplifier cascade 80. The first bias circuit 71 is connected to the first differential amplifier 10, the second bias circuit 72 to the second amplifier 20, and the third circuit 73 to the third amplifier 30.

Bias circuit 71 has an NMOS transistor $N_3$ connected to the G node, which is the connection node of the two NMOS transistors $N_2$ and $N_4$ of the amplifier 10. The bias circuit 71 further has a fixed current source $b_1$, also connected to the G node of the amplifier 10. Due to the presence of the current source $b_1$ in the bias circuit 71 that produces a constant current $I_6$, the low-frequency operation characteristics of the VCO device can be maintained. When the input voltage signal to the voltage-to-current converter 60 reaches a level that drives the bias current $I_5$ as output by the differential amplifier 10 to approach zero, the current $I_6$ supplied by the current source $b_1$ would then provide the charging and discharging of the VCO. This allows the VCO device to avoid the non-linear operating region of the voltage-to-current converter 60. The other circuits are similarly connected. Thus, The current $I_6$ supplied by the current source $b_1$ constitutes the basic current to prevent the oscillation from falling into the noise-infected non-linear region of operation. The low-frequency operating characteristics of the entire VCO device become linear. So the VCO device of the present invention features extended practical voltage-frequency range, particularly at the low-frequency end of the voltage-frequency response.

The pair of NMOS differential input transistors are each connected to a pair of PMOS load transistors, such as the $N_2$ and $N_4$ pair and the $P_1$ and $P_2$ and the $P_3$ and $P_4$ pairs, which allows the load current difference I between the two load currents I3 and I4 coming out of the two symmetrically configured sections of the differential amplifier 10 to be inherently at its minimum possible value. The circuit component configuration in each of the differential amplifiers 10, 20 and 30, due to their parallel multiplicity connection, achieves the minimum possible load current difference even when the control over the symmetry of the NMOS and PMOS transistors during the process of semiconductor fabrication results in their being fabricated with noticeable misalignment.

For example, when device match is considered, a comparison of the amount of the operating voltage shift at node A between the differential-type VCO of the prior art and the present invention is described below:

In the prior art differential-type VCO device of FIG. 2 (Prior Art), when the level of device mismatch is not severe, the current $I_5$ flowing through the NMOS transistor $N_5$ connected to the first differential amplifier 10 can be expressed by the following:

$$\frac{I_5}{I_2} = \frac{(W/L)_{N_5}}{(W/L)_{N_2}} = \frac{2(W/L)_{P_3}}{(W/L)_{P_2}}$$

However, when the fabricated semiconductor is subjected to device mismatch conditions, the equivalent expression for the current $I_5$, flowing through the NMOS transistor $N_5$, is instead, expressed as:

$$\frac{I_5'}{I_2} = \frac{(W/L)'_{N_5}}{(W/L)_{N_2}},$$

wherein $(W/L)'_{N_5}$ denotes the width/length ratio of the mismatched device as fabricated. The discrepancy between the currents $I_5$ and $I_5'$ is $\Delta I_5$, that is:

$$I_5' = I_5 + \Delta I_5 \qquad (20)$$

Thus, in this prior art differential-type VCO device, since the gate voltage of the PMOS transistors $P_3$ and $P_4$, VGS are maintained at a fixed value:

$$\Delta I_5 = [(gd)_{P_3} + (gd)_{P_4}] \cdot \Delta V(A) = [2(gd)_{P_3}] \cdot \Delta V(A),$$

wherein $$(gd)_{P_3} = (gd)_{P_4}'$$

therefore, in FIG. 2, the voltage discrepancy at node A in the prior art differential-type VCO can be obtained by:

$$\Delta V(A) \text{ (prior art)} = \frac{\Delta I_5}{2(gd)_{P_3}}$$

Based on similar reasoning, for the differential-type VCO of the present invention as exemplified in FIG. 4, when $\Delta I_5$ denotes the current discrepancy between the currents $I_5$ and $I_5'$, then:

$$\Delta I_5 = ((gm)_{P_1} + (gm)_{P_2} + (gm)_{P_3} + (gm)_{P_4}) \cdot \Delta V(A) + ((gd)_{P_1} + (gd)_{P_2} + (gd)_{P_3} + (gd)_{P_4}) \cdot \Delta V(A)$$

Since the PMOS transistors $P_1$, $P_2$, $P_3$ and $P_4$ are working in their respective saturation region, the transconductances for the transistors $P_1$, $P_2$, $P_3$ and $P_4$ are greatly larger than the drain conductances thereof:

$$(gm)_{P_1-P_4} \gg (gd)_{P_1-P_4}$$

Thus, the voltage discrepancy for the node A in the differential-type VCO device of the present invention can be approximated as:

$$\Delta V(A) \text{ (this invention)} \approx \frac{\Delta I_5}{(gm)_{P_1} + (gm)_{P_2} + (gm)_{P_3} + (gm)_{P_4}} \qquad (1)$$

$$= \frac{\Delta I_5}{4(gm)_{P_1}}, \qquad (2)$$

wherein $$(gm)_{P_1} = (gm)_{P_2} = (gm)_{P_3} = (gm)_{P_4}$$

A comparison of equations (1) and (2) derived above shows that the voltage ratio at nodes A between the prior art differential-type VCO device and the present invention is about one to two orders of magnitude:

$$\frac{\Delta V(A) \text{(this invention)}}{\Delta V(A) \text{(prior art)}} = \frac{2(gd)_{P_3}}{4(gm)_{P_1}} \approx 0.1 \sim 0.01$$

Under normal conditions, the $(g_d/g_m)$ ratio for the MOS transistors working in their saturated regions is about 0.1~0.01.

Figure 6:
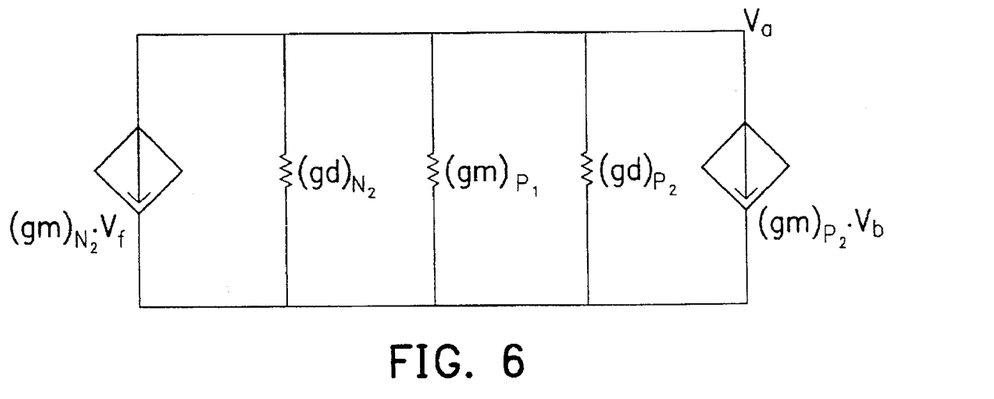
FIG. 6 is a schematic diagram of an equivalent circuit of the differential-type VCO device in accordance with the present invention.

On the other hand, consider the AC characteristics of the differential-type VCO devices of the present invention. FIG. 6 shows the equivalent circuit of the differential-type VCO device in accordance with the present invention, as embodied in FIG. 4 of the drawing. In the equivalent circuit:

$V_f$ is the differential input excitation at node F;

$(gm)_{N_2}$ is the transconductance of the NMOS transistor $N_2$;

$(gd)_{N_2}$ is the drain conductance of the NMOS transistor $N_2$;

$(gm)_{P_1}$ is the transconductance of the PMOS transistor $P_1$;

$(gd)_{P_2}$ is the drain conductance of the PMOS transistor $P_2$;

$(gm)_{P_2}$ is the transconductance of the PMOS transistor $P_2$;

$V_a$ is the voltage of the output signal at node A;

$V_b$ is the voltage of the inverted output signal at node B, with $V_b = -V_a$;

Based on the equivalent circuit of FIG. 6, there can be established the following equation:

$$(gm)_{N_2} \cdot V_f + (gd)_{N_2} \cdot V_a + (gm)_{P_1} \cdot V_a + (gd)_{P_2} \cdot V_a + (gm)_{P_2} \cdot V_b = 0$$

and since $V_a = -V_b$, the term in the above equation can be removed by division to obtain the following expression:

$$(gm)_{P_1} = (gm)_{P_2},$$

wherein the PMOS transistors $P_1$ and $P_2$ are maintained in their linear region of operation respectively, and leading to the condition:

$$A_{VVCO-1} = \frac{V_a}{V_f} = \frac{(gm)_{N_2}}{(gd)_{N_2} + (gd)_{P_2}} \gg 1$$

Thus, based on the above equations describing the equivalent circuitry of the differential-type VCO device of the present invention, it can be seen that even when the semiconductor fabrication process involves mismatching that causes noticeable non-symmetry in the component configuration dimensions among the transistors $P_1$, $P_2$, $P_3$ and $P_4$, the effect of the undesirable non-symmetry is reflected only a little in the dc voltages that appear at the nodes A and B in the VCO device. The voltage gain $A_{VVCO-1}$ at nodes F and E would still be greatly larger than 1 to ensure that the ac signals of the VCO device are not decayed. So the oscillation of the ac signals of the VCO device is stable.

For low-frequency operation, in the case of the differential-type VCO device of the present invention, a current source (b1, b2, b3) is provided that is internal to each of the bias circuits 71, 72 and 73. Accordingly, the entire VCO device can be ensured to have good low-frequency operating characteristics.

Consider again the first stage involving the differential amplifier 10 and the first bias circuit 71 of FIG. 4. Due to the presence of the current source $b_1$ in the bias circuit 71 that produces a constant current $I_6$, the low-frequency operation characteristics of the VCO device can be maintained. When the input voltage signal to the voltage-to-current converter 60 reaches a level that drives the bias current $I_5$ as output by the differential amplifier 10 to approach zero, the current $I_6$ supplied by the current source $b_1$ would then provide the charging and discharging of the VCO. This allows the VCO device to avoid the non-linear operating region of the voltage-to-current converter 60. This is more clearly shown in FIG. 5, in which the voltage-frequency characteristics of the differential-type VCO of the present invention are shown.

Figure 5:
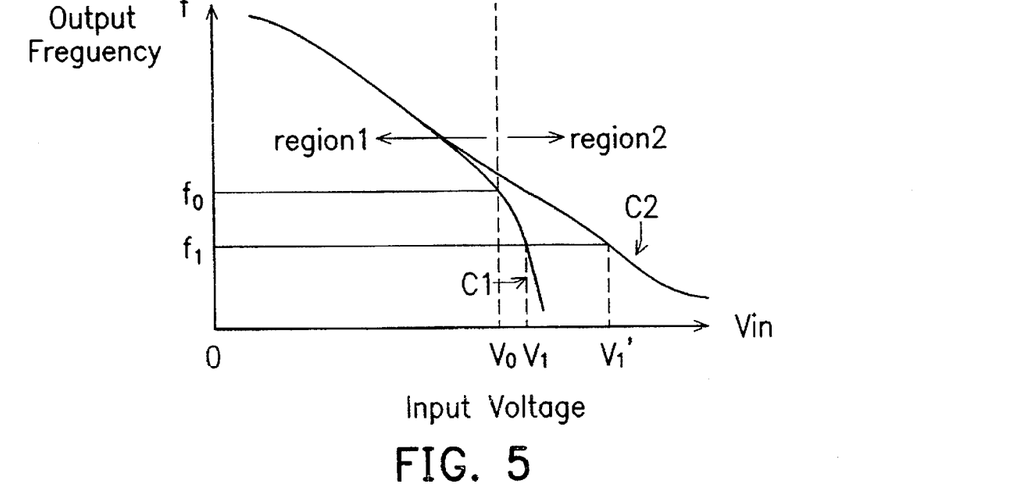
FIG. 5 is a graph of the voltage-frequency characteristics of the differential-type VCO with low-frequency stability compensation in accordance with the preferred embodiment of the present invention.

As is depicted in FIG. 5, the same reference symbols are the same as those used in FIG. 3, and their description is omitted. The presence of the current source $b_1$ in bias circuit 71 allows the entire VCO device to maintain linear voltage-frequency characteristics even when the input voltage $V_{in}$ to the VCO device falls within the non-linear region, region 2, when the current source $b_1$ is not installed. The current $I_6$ supplied by the current source $b_1$ constitutes the basic current to prevent the oscillation from falling into the noise-infected non-linear region of operation.

The presence of the current source b1 allows the VCO device to switch from the $C_1$ characteristic curve in FIG. 5, when the input voltage $V_{in}$ falls in the normal linear region of the device, to the $C_2$ characteristic curve that extends the linearity region of the entire VCO voltage-frequency response range when the input voltage $V_{in}$ enters the otherwise non-linear region 2. For example, the characteristic curve $C_2$ is still smooth, when the input voltage Vin is $V_1'$ and the output frequency f is $f_1$. Thus, a small amount of change in the input voltage $V_1'$ could not result in a drastic amount of change in the output frequency $f_1$. Without the presence of the current source to compensate for the low-frequency current, the voltage-frequency response as featured by the curve $C_1$ in region 2 would not have been useful for any practical purpose, since, as already explained, the frequency of the generated signal would be too sensitive to the noise that propagates into the VCO device. With the use of the differential-type VCO of the present invention that features compensated low-frequency stability, the operating range of the VCO device is extended greatly, enhancing the usefulness of the VCO device.

The device fabrication mismatches that are impossible to avoid in fabrication of any practical semiconductor device will not affect the usefulness of the VCO device of the present invention. This allows the VCO device of the present invention to be fabricated with reasonable precision and good voltage-frequency characteristics. Furthermore, the VCO device of the present invention also features extended practical voltage-frequency range, particularly at the low-frequency end of the voltage-frequency response curve. All these advantages reduce the cost of the VCO device in comparison with the VCO device of the prior art.

We claim:

1. A differential-type voltage-controlled oscillator with low-frequency stability compensation, comprising:

a voltage-to-current converter for converting an input voltage signal into a bias current signal to control a frequency of an output of said voltage-controlled oscillator;

a plurality of stages of differential amplifiers connected in cascade, each stage comprising a pair of differential input MOS transistors of a first type, each of said input transistors being connected to a pair of MOS load transistors of a second type, the gate terminal of one of said pair of load transistors being connected to one of said drain terminals thereof, and the gate terminal of the other of said pair of load transistors being connected to the drain terminal of one of the other pair of load transistors; and a plurality of stages of bias circuits connected in cascade, each of said bias circuits being connected to a corresponding stage of said differential amplifiers for receiving a bias current in response to the bias current signal generated by said voltage-to-current converter, and each bias circuit stage comprising a current source for supplying a constant current to maintain the low-frequency voltage-frequency linearity of the output of said voltage-controlled oscillator.

2. The differential-type voltage-controlled oscillator of claim 1, wherein:

said pair of load transistors are connected in parallel by connecting each of the drain and source terminals of one load transistor to the corresponding drain and source terminal of the other.

3. The differential-type voltage-controlled oscillator of claim 1, wherein each bias circuit stage comprises a biasing MOS transistor of the first type connected in parallel with said current source.

4. The differential-type voltage-controlled oscillator of claim 1, wherein the output of each differential amplifier stage is connected to the input of the next, with the output of the last stage being connected to the input of the first.

5. The differential-type voltage-controlled oscillator of claim 1, wherein said current source supplies a constant current independent of a power supply voltage to said voltage-controlled oscillator.

6. The differential-type voltage-controlled oscillator of any of claims 1, 2 and 3 to 5, wherein:

said MOS transistors of the first type are PMOS transistors; and said MOS transistors of the second type are NMOS transistors.

7. The differential-type voltage-controlled oscillator of any of claims 1, 2 and 3 to 5, wherein:

said MOS transistors of the first type are NMOS transistors; and said MOS transistors of the second type are PMOS transistors.

8. A differential-type voltage-controlled oscillator with low-frequency stability compensation, comprising:

a voltage-to-current converter for converting an input voltage signal into a biasing current signal to control a frequency of an output of said voltage-controlled oscillator;

a plurality of stages of differential amplifiers connected in cascade, each of said stages comprising a pair of differential input MOS transistors of a first type, each of said first type of MOS transistors being connected to a pair of MOS load transistors of a second type, said load transistors comprising a pair of MOS transistors of the second type, said pair of load transistors being connected in parallel by connecting each of the drain and source terminals of one load transistor to the corresponding drain and source terminals of the other, and the gate terminal of one of said pair of load transistors being connected to one of said drain terminals thereof, and the gate terminal of the other of said pair of load transistors being connected to the drain terminal of one of the other pair of load transistors; and a plurality of stages of bias circuits connected in cascade, with each of said bias circuits connected to a corresponding stage of said differential amplifiers for receiving a bias current in response to the bias current signal generated by said voltage-to-current converter, and each of said stages of bias circuits comprising a current source for supplying a constant current to maintain the low-frequency voltage-frequency linearity of the output of said voltage-controlled oscillator, and a biasing MOS transistor of the first type connected in parallel with said current source.

9. The differential-type voltage-controlled oscillator of claim 8, wherein the output of each of said plurality of stages of differential amplifiers being connected to the input of the next, with the output of the last of said stages of differential amplifiers being connected to the input of the first.

10. The differential-type voltage-controlled oscillator of claim 8, wherein said current source supplies a constant current independent of the power supply voltage to said voltage-controlled oscillator.

11. The differential-type voltage-controlled oscillator of any of claims 8 to 10, wherein said MOS transistors of the first type are PMOS transistors, and said MOS transistors of the second type are NMOS transistors.

12. The differential-type voltage-controlled oscillator of any of claims 8 to 10, wherein said MOS transistors of the first type are NMOS transistors, and said MOS transistors of the second type are PMOS transistors.

13. A differential-type voltage-controlled oscillator with low-frequency stability compensation, comprising:

a voltage-to-current converter for converting an input voltage signal into a biasing current signal to control a frequency of an output of said voltage-controlled oscillator;

a plurality of stages of differential amplifiers connected in cascade, each of said stages comprising two differential input MOS transistor of a first type and four MOS load transistors of a second type;

said input MOS transistors comprising a first and second input transistors;

said MOS load transistors comprising a first, second, third and fourth load transistors;

the first input transistor connected to the first and second load transistors, and the second input transistor connected to the third and fourth load transistors;

a gate terminal of the first load transistor connected to a drain terminal thereof, a gate terminal of the fourth transistor connected to a drain terminal thereof, a gate terminal of the second load transistor connected to a drain terminal of the third load transistor, and a gate terminal of the third load transistor connected to a drain terminal of the second load transistor;

the first and second load transistors being connected in parallel with the drain terminal of the first load transistor connected to the drain terminal of the second transistor, and a source terminal of the first load transistor connected to a source terminal of the second load transistor;

the third and fourth load transistors being connected in parallel with the drain terminal of the third load transistor connected to the drain terminal of the fourth load transistor, and a source terminal of the third load transistor connected to a source terminal of the fourth load transistor;

a plurality of stages of bias circuits connected in cascade, with each of said bias circuits connected to a corresponding stage of said differential amplifiers for receiving a bias current in response to the bias current signal generated by said voltage-to-current converter; and each of said stages of bias circuits comprising a current source for supplying a constant current to maintain the low-frequency voltage-frequency linearity of the output of said voltage-controlled oscillator, and a biasing MOS transistor of the first type connected in parallel with said current source.

14. The differential-type voltage-controlled oscillator of claim 13, wherein:

each bias circuit stage comprises a biasing MOS transistor of the first type connected in parallel with said current source.

15. The differential-type voltage-controlled oscillator of claim 13, wherein:

an output of each differential amplifier stage is connected to an input of the next, with the output of the last stage being connected to the input of the first.

16. The differential-type voltage-controlled oscillator of claim 13, wherein:

said current source supplies a constant current independent of a power supply voltage to said voltage-controlled oscillator.

17. The differential-type voltage-controlled oscillator of any of claims 13 to 16, wherein:

said MOS transistors of the first type are PMOS transistors; and said MOS transistors of the second type are NMOS transistors.

18. The differential-type voltage controlled oscillator of any of claims 13–16, wherein:

said MOS transistors of the first type are NMOS transistors; and said MOS transistors of the second type are PMOS transistors.

* * * * *